(12) United States Patent
Aoki

(10) Patent No.: US 8,743,633 B2
(45) Date of Patent: Jun. 3, 2014

(54) INTEGRATED SEMICONDUCTOR DEVICE

(75) Inventor: Takenori Aoki, Kanagawa (JP)

(73) Assignee: Sony Corporation, Tokyo (JP)

( * ) Notice: Subject to any disclaimer, the term of this patent is extended or adjusted under 35 U.S.C. 154(b) by 408 days.

(21) Appl. No.: 13/067,597

(22) Filed: Jun. 13, 2011

(65) Prior Publication Data

US 2012/0026811 A1  Feb. 2, 2012

(30) Foreign Application Priority Data

Jul. 27, 2010 (JP) .................................. 2010-167771

(51) Int. Cl.
  *G11C 29/32* (2006.01)
  *G11C 7/22* (2006.01)
  *G11C 7/10* (2006.01)

(52) U.S. Cl.
  USPC .................. 365/189.17; 365/233.1; 365/201; 365/189.05; 365/189.12; 713/400; 713/401; 713/500; 713/501; 713/600; 714/727; 714/731

(58) Field of Classification Search
  USPC .................. 365/189.05, 189.17, 201, 233.1, 365/189.12; 713/400, 401, 500, 501, 600; 714/727, 731
  See application file for complete search history.

(56) References Cited

U.S. PATENT DOCUMENTS 5,056,094 A * 10/1991 Whetsel ........................ 714/736
5,648,973 A *  7/1997 Mote, Jr. ....................... 714/727

FOREIGN PATENT DOCUMENTS

JP     2009-047486     3/2009

* cited by examiner

*Primary Examiner* — J. H. Hur
(74) *Attorney, Agent, or Firm* — Sony Corporation of America

(57) ABSTRACT

An integrated semiconductor device including: a first semiconductor device having a clock generation section, first data storage sections storing input data as transfer data, data output terminals provided, one for each of the first data storage sections, and a clock output terminal adapted to output a transfer clock; and a second semiconductor device having data input terminals which receive the transfer data, a clock input terminal adapted to receive the transfer clock, second data storage sections associated with the data input terminals respectively to store input data, and selection sections associated with the second data storage sections respectively to select either the transfer data or data shifted and output to the associated second data storage section in a first series circuit which is formed by connecting the second data storage sections in series, the selection sections supplying the selected data to the associated second data storage section.

10 Claims, 10 Drawing Sheets

F I G . 1
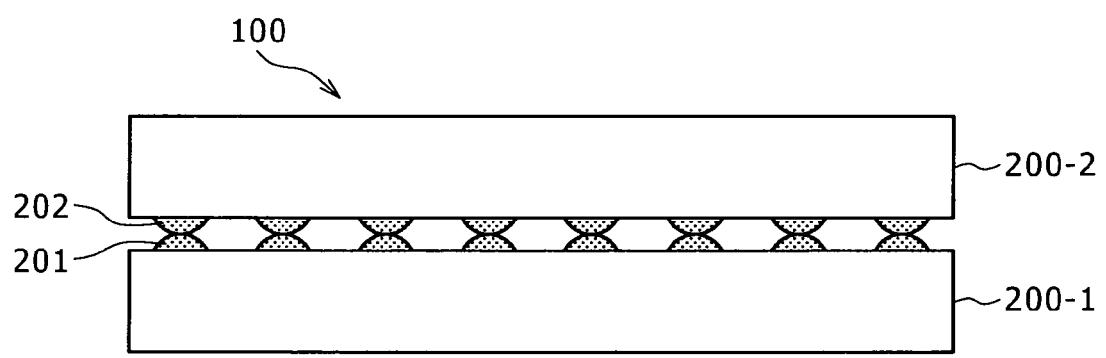

INTEGRATED SEMICONDUCTOR DEVICE

BACKGROUND

The present disclosure relates to an integrated semiconductor device having semiconductor devices integrated therein, and more particularly to an integrated semiconductor device having a circuit adapted to test whether or not the connection status is appropriate between the semiconductor devices making up the integrated semiconductor device.

The boundary-scan technique is known in related art as a technique for testing whether or not the connection is appropriate between semiconductor chips (hereinafter also referred to as the connection test). The boundary-scan technique has been standardized as the IEEE Standard 1149.1 Standard Test Access Port and Boundary-Scan Architecture. This boundary-scan standard was laid down by the JTAG (Joint Test Action Group).

In the connection test using the boundary-scan technique, an internal circuit for the boundary-scan technique is incorporated in advance into the semiconductor chips under test. This internal circuit is also called a boundary-scan cell and provided for each of the terminals used for connection between the semiconductor chips and external equipment. Then, these semiconductor chips are connected together in daisy chain fashion, and signals are transmitted to and from external equipment by controlling the boundary-scan cells provided therein. As a result, the connection between the semiconductor devices can be tested to determine whether or not the connection is appropriate.

However, the boundary-scan technique uses a boundary-scan cell for each of the terminals of the semiconductor chips, thus resulting in a significantly larger circuit scale.

For this reason, the following technique is known as a traditional technique in relation to the connection test between two semiconductor chips. That is, a testing circuit including a flip-flop and switch is inserted between each of the terminals of the two semiconductor chips and the internal circuit. Then, during testing, the switch status is changed to form a signal path that connects the input and output of each of the flip-flops of the two semiconductor chips in series. In this condition, data is successively supplied to the flip-flops to write the data. Next, the switch status is changed to form a signal path that connects each of the flip-flops of one of the semiconductor device to one of the flip-flops of the other semiconductor device via the associated terminal. This allows for data to be shifted from each of the flip-flops of one of the semiconductor device to one of the flip-flops of the other semiconductor device. Finally, a signal path is formed that connects the input and output of each of the flip-flops of the two semiconductor chips in series to read the data, thus determining whether or not the connection is appropriate between the terminals based on the read data (refer, for example, to Japanese Patent Laid-Open No. 2009-47486 (FIG. 1)).

With such a configuration based on the traditional technique, only a flip-flop and switch adapted to change the signal path are incorporated for each terminal, thus providing a smaller circuit scale than the boundary-scan technique.

SUMMARY

The connection test is designed to examine a DC characteristic, namely, the continuity of wiring between semiconductor devices. In contrast, an AC characteristic test is also performed to examine whether data is transferred properly during data transfer between semiconductor devices conducted at the practical speed for normal operation. The connection test and AC characteristic test are conducted as different test procedures because different circuits and terminals are used in the semiconductor devices. From the above reason, it is preferred that the test adapted to examine the AC characteristic for data transfer between semiconductor devices as described above can be performed simultaneously with the connection test because this provides improved testing efficiency.

However, the above traditional technique uses two independent clocks between the two chips. Moreover, these clocks used during testing are generally set to a speed lower than that used for normal operation. Therefore, it is difficult to perform the AC characteristic test at a data transfer speed for normal operation together with the connection test performed using the above traditional technique. It should be noted that the same holds true for the boundary-scan technique in this regard.

The present disclosure has been made in light of the foregoing, and it is desirable to be able to perform the AC characteristic test for data transfer between semiconductor devices together with the connection test between semiconductor devices in an integrated semiconductor device.

According to a first mode of the present disclosure, there is provided an integrated semiconductor device that includes first and second semiconductor devices. The first semiconductor device includes a clock generation section, first data storage sections, data output terminals and clock output terminal. The clock generation section generates a clock. The first data storage sections store input data as transfer data to be transferred to the second semiconductor device in synchronism with the clock. The data output terminals are provided, one for each of the first data storage sections, to output the transfer data. The clock output terminal outputs the clock as a transfer clock. The second semiconductor device includes data input terminals, clock input terminal, second data storage sections and selection sections. The data input terminals are connected to the data output terminals to receive the transfer data. The clock input terminal is connected to the clock output terminal to receive the transfer clock. Each of the second data storage sections is associated with one of the data input terminals to store input data in synchronism with the transfer clock. Each of the selection sections is associated with one of the second data storage sections and selects either the transfer data received from the data input terminal or data shifted and output to the associated second data storage section in a first series circuit. The first series circuit is formed by successively connecting the second data storage sections in series. Each of the selection sections supplies the selected data to the associated second data storage section. This provides an advantageous effect in that transfer data is transferred from the first to second semiconductor device in synchronism with the transfer clock that is based on the clock generated in the first semiconductor device during the connection test.

Further, in the first mode, the first semiconductor device may further include a phase adjustment section. The phase adjustment section sets a predetermined phase difference between the transfer data and transfer clock so that the hold time and setup time conditions are fulfilled. The phase adjustment section allows for the transfer data and transfer clock with the predetermined phase difference therebetween to be output from the data output terminal and clock output terminal. This provides an advantageous effect in that transfer data is transferred from the first to second semiconductor device in synchronism with the transfer clock in such a manner as to guarantee the setup and hold times.

Still further, in the first mode, the clock generation section may generate the clock at a data transfer frequency for a predetermined data transfer speed so that the transfer data is transferred to the second semiconductor device at the predetermined data transfer speed. This provides an advantageous effect in that the transfer data is transferred from the first to second semiconductor device at the data transfer speed necessary for the connection test.

Still further, in the first mode, the first semiconductor device may further include a first transfer data shift circuit. The first transfer data shift circuit is formed by successively connecting in series one or more third data storage sections in a transmission path of the transfer data from the first data storage section to the data output terminal. The third data storage sections store input data in synchronism with the clock. The clock generation section may generate the clock that includes the number of pulses set based on the number of the third data storage sections so that the data stored in the first data storage section is shifted to and stored in the third data storage section at the final stage of the first transfer data shift circuit. This provides an advantageous effect in that the transfer data stored in the first data storage section is stored in the third data storage section at the final stage of the first semiconductor device prior to the transfer of the transfer data to the second semiconductor device.

Still further, in the first mode, when generating the clock that includes the number of pulses set based on the number of the third data storage sections, the clock generation section may set a frequency lower than the data transfer frequency. This provides an advantageous effect in that the transfer data is shifted from the first data storage section to the third data storage section at the final stage at a low speed.

Still further, in the first mode, the second semiconductor device may further include a second transfer data shift circuit. The second transfer data shift circuit is formed by successively connecting in series fourth data storage sections in the transmission path of the transfer data from the data input terminal to the second data storage sections. The fourth data storage sections store input data in synchronism with the clock. The clock generation section may generate the clock that includes the number of pulses set based on the number of the fourth data storage section provided from the predetermined fourth data storage section to the final stage so that the transfer data stored in the predetermined fourth data storage sections in the second transfer data shift circuit is shifted to and stored in the second data storage section. This provides an advantageous effect in that, of the transfer data successively transferred to the second semiconductor device, that stored in the predetermined fourth data storage section is stored in the second data storage section.

Still further, in the first mode, when generating the clock that includes the number of pulses set based on the number of the fourth data storage sections provided from the predetermined fourth data storage section to the final stage, the clock generation section may set a frequency lower than the data transfer frequency. This provides an advantageous effect in that the transfer data is shifted from the predetermined fourth data storage section to the second data storage section at a low speed.

Still further, the integrated semiconductor device according to the first mode may further include a second series circuit. The second series circuit is formed by successively connecting the first data storage sections in series to successively receive data with a predetermined value. The clock generation section may generate the clock that includes the number of pulses set based on the number of the first data storage sections so that the data with the predetermined value is stored in the first data storage section as the transfer data. This provides an advantageous effect in that the transfer data with the predetermined value is stored in each of the first data storage sections while at the same time shifting the data with the predetermined value between the first data storage sections that are connected in series.

Still further, in the first mode, when generating the clock that includes the number of pulses set based on the number of the first data storage sections, the clock generation section may set a frequency lower than the data transfer frequency. This provides an advantageous effect in that the data is shifted between the first data storage sections that are connected in series at a low speed.

Still further, in the first mode, the clock generation section may generate the clock that includes the number of pulses set based on the number of the second data storage sections so that the transfer data stored in the second data storage sections is successively output from the first series circuit to external equipment. This provides an advantageous effect in that the transfer data stored in each of the second data storage sections is successively read to an external tester.

Still further, in the first mode, when generating the clock that includes the number of pulses set based on the number of the second data storage sections, the clock generation section may set a frequency lower than the data transfer frequency. This provides an advantageous effect in that the data is shifted at a low speed between the second data storage sections that are connected in series.

Still further, the integrated semiconductor device according to the first mode may further include a transfer data toggling circuit. The transfer data toggling circuit successively toggles the value of the transfer data stored in the first data storage sections in synchronism with the clock. This provides an advantageous effect in that the transfer data with the successively toggled value is continuously transferred to the second semiconductor device.

The present disclosure can produce an advantageous effect in that the AC characteristic test for data transfer between semiconductor devices can be performed together with the connection test between semiconductor devices.

BRIEF DESCRIPTION OF THE DRAWINGS

FIG. 1 is a diagram illustrating an example of overall structure of a multilayer semiconductor device according to embodiments of the present disclosure;

DETAILED DESCRIPTION OF THE PREFERRED EMBODIMENTS

Figure 2:
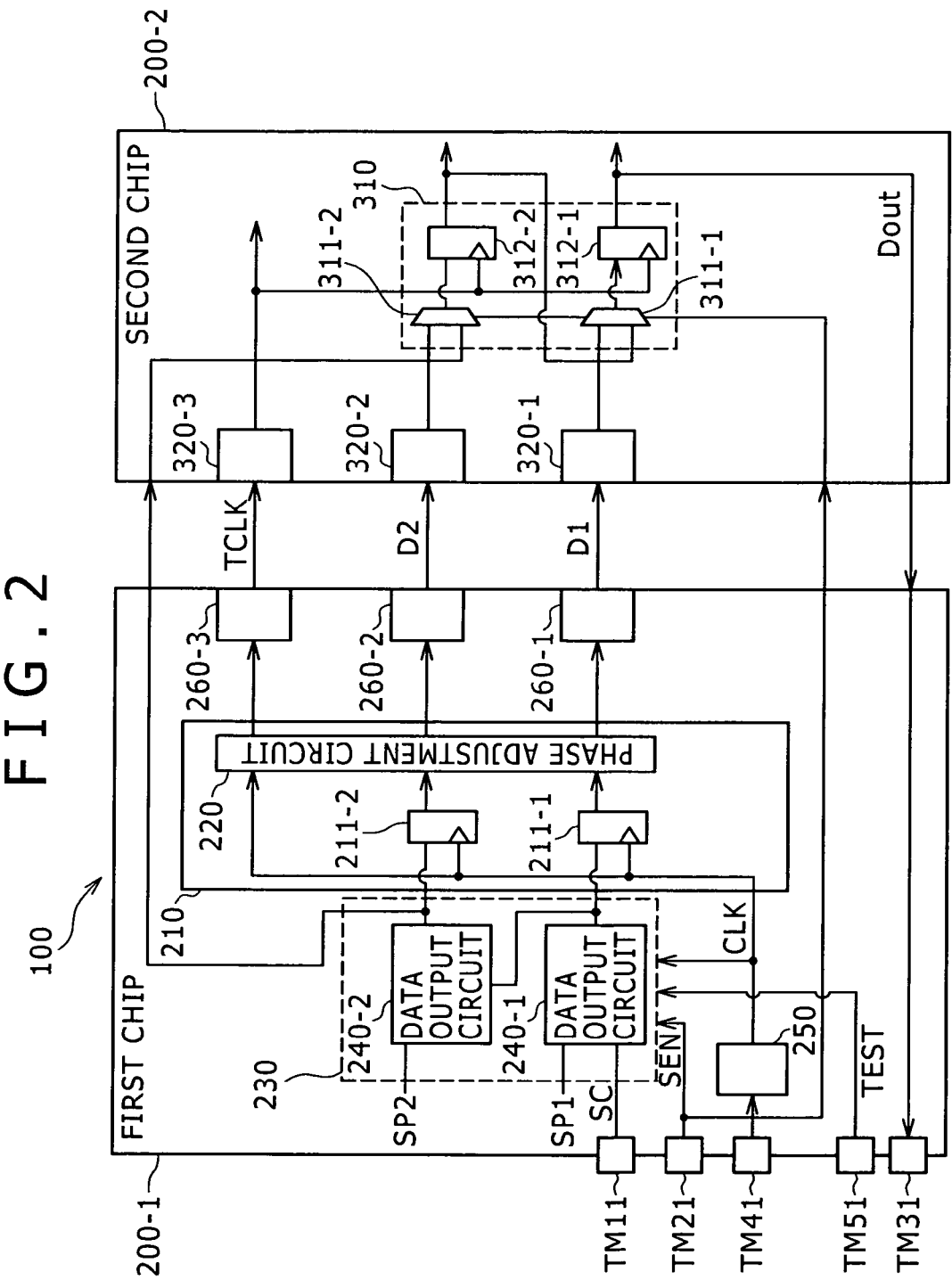
FIG. 2 is a diagram illustrating a configuration example of chips according to a first embodiment of the present disclosure.

A description will be given below of the modes for carrying out the present disclosure (hereinafter referred to as embodiments). It should be noted that the description will be given in the following order.
1. First embodiment (data transfer between chips at a data transfer speed for normal operation during the connection test: basic example)
2. Second embodiment (data transfer between chips at a data transfer speed for normal operation during the connection test: example in which a boundary-scan circuit is used in combination)
3. Third embodiment (data transfer between chips at a data transfer speed for normal operation during the connection test: example in which there is another register between the register and output terminal in the chip on the data output side)
4. Fourth embodiment (data transfer between chips at a data transfer speed for normal operation during the connection test: example in which there is another register between the input terminal and register in the chip on the data input side)
5. Fifth embodiment (data transfer between chips at a data transfer speed for normal operation during the connection test: example in which the scan chain interconnects are separate between the input and output sides)

1. First Embodiment

[Overall Configuration Example of the Multilayer Semiconductor Device]

FIG. 1 is a diagram illustrating an example of overall structure of a multilayer semiconductor device 100 which is an example of an integrated semiconductor device according to embodiments of the present disclosure. The multilayer semiconductor device shown in FIG. 1 includes two chips, first and second chips 200-1 and 200-2, stacked one on top of another. In this case, the two chips are stacked so that the first chip 200-1 is located on the bottom, and the second chip 200-2 on the top. Each of the first and second chips 200-1 and 200-2 is an example of the semiconductor device defined in one or more of the claims.

Microbumps 201 are formed on the top surface of the first chip 200-1, and microbumps 202 are formed on the bottom surface of the second chip 200-2. As illustrated in FIG. 1, each of the microbumps 201 is joined to one of the microbumps 202 formed at the associated position when the first and second chips 200-1 and 200-2 are stacked one on top of another. It should be noted that, of the paired microbumps 201 and 202 joined together, those included in the signal path adapted to transfer the transfer data during the connection test are each an example of data output and input terminals defined in one or more of the claims.

In the present embodiment of the disclosure, the junction (connection) between the microbumps of the two chips is tested to determine whether or not the junction is appropriate in the multilayer semiconductor device 100 shown in FIG. 1. That is, the connection test is performed. Moreover, another test (speed test) is also performed simultaneously with the connection test to determine whether or not data is properly transferred between the chips at a data transfer speed for normal operation.

[Example of the Internal Structures of the Chips]

FIG. 2 is a diagram illustrating an example of the internal structures of the first and second chips 200-1 and 200-2 of the multilayer semiconductor device 100 according to a first embodiment of the present disclosure. It should be noted that FIG. 2 mainly shows only the components of the first and second chips 200-1 and 200-2 used for the connection test according to the present embodiment of the disclosure and that the internal circuits and other components operating during normal operation are not shown.

In FIG. 2, the first chip 200-1 serves as an output side adapted to output transfer data to be transferred between the chips, and the second chip 200-2 serves as an input side adapted to receive the transfer data. Further, transmission paths are formed between the first and second chips 200-1 and 200-2 to transmit a transfer clock TCLK, transfer data D1, transfer data D2, scan enable signal SEN, scan signal SC and output data Dout. Practically, these paths are formed by interconnects made by joining the microbumps 201 and 202 illustrated in FIG. 1. It should be noted that these paths may be formed by interconnects made, for example, by wire bonding.

The first chip 200-1 includes an interface circuit 210, data output section 230 and clock generation section 250. Further, the first chip 200-1 includes terminals TM11, TM21, TM31, TM41 and TM51 to be connected, for example, to an external tester (not shown) for the connection test.

The data output section 230 outputs signals from a system path SP to the interface circuit 210 during normal operation and successively outputs transfer data for testing to the second chip 200-2 during testing. During testing, on the other hand, switching is made between two signal paths, one adapted to output transfer data to the interface circuit 210 as described above and another adapted to receive the scan signal SC that is used to write the initial value of the transfer data to the internal registers as will be described later.

In the configuration illustrated in FIG. 2, the two pieces of transfer data, i.e., the transfer data D1 and D2, are transferred between the first and second chips 200-1 and 200-2. During the connection test, the transmission paths of the transfer data D1 and D2 are subjected to the connection test.

The data output section 230 shown in FIG. 2 includes two data output circuits 240-1 and 240-2 for the transmission paths of the transfer data D1 and D2. The pieces of data output from the data output circuits 240-1 and 240-2 during the data transfer period at the time of testing which will be described later serve as the transfer data D1 and D2. It should be noted that an internal configuration example of the data output circuits 240-1 and 240-2 will be described later.

It should be noted that although only the two pieces of transfer data, i.e., the transfer data D1 and D2, are shown to simplify the illustration and description in FIG. 2, transmission paths of many more pieces of transfer data are practically formed, and each of these transmission paths is subjected to the connection test.

The interface circuit 210 processes data exchanged with the other chip, for example, via microbumps or wire bonds. It should be noted that FIG. 2 shows only the components of the interface circuit 210 used for the signals to be output from the first chip 200-1 for the connection test for convenience of description.

The interface circuit 210 shown in FIG. 2 includes registers 211-1 and 211-2. The same circuit 210 also includes a phase adjustment circuit 220. The registers 211-1 and 211-2 are associated respectively with the data output circuits 240-1 and 240-2. The value stored in a register 241-1 of the data output circuit 240-1 is output to the register 211-1. The value stored in a register 241-2 of the data output circuit 240-2 is output to the register 211-2. Each of the registers 211-1 and 211-2 is an example of the third data storage section and a first transfer data shift circuit defined in one of more of the claims.

The phase adjustment circuit 220 receives a clock CLK and data to be transmitted to the second chip 200-2 and adjusts the phases thereof so as to guarantee the setup and hold times. Here, the clock CLK whose phase has been adjusted by the phase adjustment circuit 220 is output to the second chip 200-2 via an input/output cell 260-3 as the transfer clock TCLK. It should be noted that the microbump 201 (refer to FIG. 1) that is provided for the input/output cell 260-3 and from which the transfer clock TCLK is output is an example of the clock output terminal defined in one or more of the claims. Further, the phase adjustment circuit 220 is an example of the phase adjustment section defined in one or more of the claims.

The outputs of the registers 211-1 and 211-2 whose phases have been adjusted by the phase adjustment circuit 220 are transmitted to the second chip 200-2 respectively via input/output cells 260-1 and 260-2 as the transfer data D1 and D2. Each of the input/output cells 260 serves, for example, as an input/output or output buffer and does not have any register or other component adapted to store data in synchronism with a clock.

The clock generation section 250 generates the clock CLK. The clock CLK generated by the clock generation section 250 is used as a system clock during normal operation. In the present embodiment of the disclosure, the clock CLK serving as a system clock is supplied as an internal clock in the chip 200-1. The clock CLK is also transmitted from the interface circuit 210 to the second chip 200-2 as the transfer clock TCLK together with transfer data via the input/output cell 260-3. During normal operation, the internal circuits of the second chip 200-2 process the data transferred from the first chip 200-1 in synchronism with the transfer clock TCLK.

In addition to the above, the clock CLK is used to transfer data during the connection test in the present embodiment of the disclosure. During the connection test, the clock generation section 250 operates in such a manner as to generate the clock CLK having a predetermined pulse pattern in response to a control signal fed through the terminal TM41.

Next, the second chip 200-2 includes input/output cells 320-1 to 320-3 and data input section 310. Each of the input/output cells 320-1 to 320-3 serves, for example, as an input/output or output buffer and does not have any register or other component adapted to store data in synchronism with a clock. The input/output cell 320-1 receives the transfer data D1 output from the input/output cell 260-1 of the first chip 200-1, outputting the transfer data D1 to a selector 311-1 of the data input section 310. The input/output cell 320-2 receives the transfer data D2 output from the input/output cell 260-2 of the first chip 200-1, outputting the transfer data D2 to a selector 311-2. The input/output cell 320-3 receives the transfer clock TCLK output from the input/output cell 260-3 of the first chip 200-1. The received transfer clock TCLK is supplied not only to the registers 312-1 and 312-2 illustrated in FIG. 2 but also to the different circuit sections of the second chip 200-2 as an operating clock. It should be noted that the second chip 200-2 operates on the received transfer clock TCLK also during normal operation. That is, the first and second chips 200-1 and 200-2 according to the present embodiment of the disclosure use the source synchronous technique designed to transmit and receive a clock together with data. In the present embodiment of the disclosure, transfer data is transferred using the source synchronous technique during the connection test as will be described later. On the other hand, the microbump 202 (refer to FIG. 1) that is provided for the input/output cell 320-3 and that receives the transfer clock TCLK is an example of the clock input terminal defined in one or more of the claims.

The data input section 310 receives and stores the transfer data D1 and D2 transferred to the second chip 200-2 during the connection test. During normal operation, on the other hand, the data input section 310 temporarily stores data output from the first chip 200-1, outputting the data to the unshown circuit at the subsequent stage.

The data input section 310 includes two pairs of a selector and register, one pair made up of the selector 311-1 and register 312-1 for the transfer data D1 and another made up of the selector 311-2 and register 312-2 for the transfer data D2.

The selector 311-1 selects either the data output from the register 312-2 or the transfer data D1 output from the first chip 200-1, outputting the selected data. On the other hand, the selector 311-2 selects either the data output from the register 241-2 of the first chip 200-1 or the transfer data D2 output from the first chip 200-1, outputting the selected data.

The selection status of each of the selectors 311-1 and 311-2 is controlled by the scan enable signal SEN fed from the first chip 200-1. We assume here that the selectors 311-1 and 311-2 select the data output from the registers 312-2 and 241-2, respectively, when the scan enable signal SEN is high. On the other hand, we assume that the selectors 311-1 and 311-2 select the transfer data D1 and D2, respectively, when the scan enable signal SEN is low.

The register 312-1 stores the data output from the selector 311-1 in synchronism with the transfer clock TCLK. The register 312-2 stores the data output from the selector 311-2 in synchronism with the transfer clock TCLK. The transfer clock TCLK is generated by the first chip 200-1 and transferred to the second chip 200-2 as described earlier. Thus, the data input section 310 of the second chip 200-2 operates on the clock that is based on the clock CLK transferred from the first chip 200-1 rather than on an independent clock available in the second chip 200-2.

It should be noted that each of the registers 312-1 and 312-2 is an example of the data storage section defined in one or more of the claims. Further, each of the selectors 311-1 and 311-2 is an example of the selection section defined in one or more of the claims.

Figure 3:
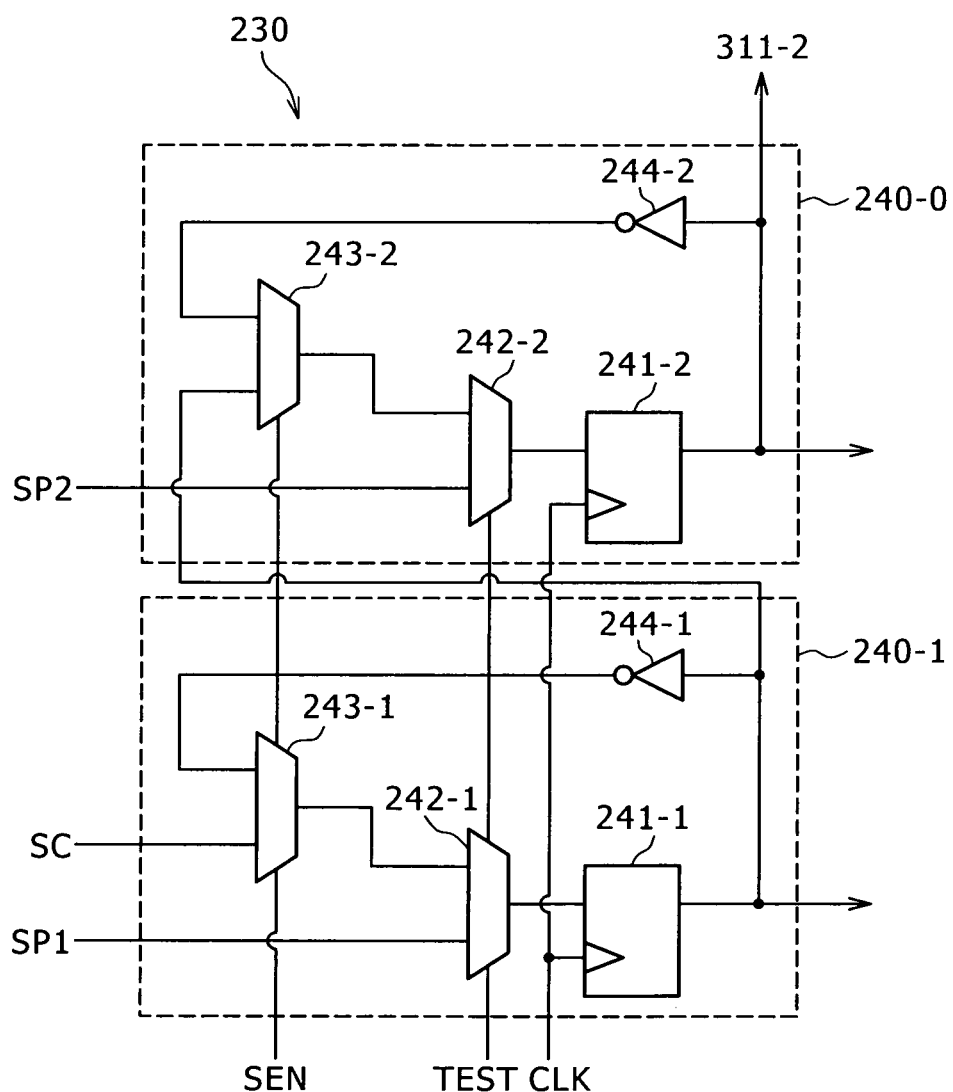
FIG. 3 is a diagram illustrating an internal configuration example of a data output section.

FIG. 3 illustrates a configuration example of the data output circuits 240-1 and 240-2 in the data output section 230 of the first chip 200-1. The data output circuit 240-1 includes the register 241-1, selectors 242-1 and 243-1 and inverter 244-1.

The register 241-1 stores data fed to its input terminal in synchronism with the clock CLK. The data stored in the register 241-1 is output from the data output circuit 240-1 and fed to the register 211-1 of the interface circuit 210.

The selector 242-1 selects either the output of the selector 243-1 fed to one of its input terminals in response to a test mode signal TEST or the data from a system path SP1 connected to its other input terminal, outputting the selected input.

The selector 243-1 selects either the output of the inverter 244-1 fed to one of its input terminals in response to the scan enable signal SEN or the scan signal SC fed to its other input terminal, outputting the selected input.

Similarly to the data output circuit 240-1, the data output circuit 240-2 includes the register 241-2, selectors 242-2 and 243-2 and inverter 244-2. It should be noted, however, that the other input terminal of the selector 243-2 is connected to the output terminal of the register 241-1. Further, the data from a system path SP2 is fed to the other input terminal of the selector 242-2. The data stored in the register 241-2 is supplied to the register 211-2 of the interface circuit 210 as the output of the data output circuit 240-2. Still further, the output terminal of the register 241-2 is connected to one of the input terminals of the selector 311-2 in the data input section 310 of the second chip 200-2. The signal path between the register 241-2 and selector 311-2 is used to transmit the scan signal SC as will be described later.

If the test mode signal TEST indicating the normal mode rather than the test mode is fed to the data output circuits 240 formed as described above, the selector 242-1 selects the data fed through the signal line of the system path SP1, outputting the selected data. Similarly, the selector 242-2 selects the data fed through the signal line of the system path SP2, outputting the selected data. Each of the system paths SP1 and SP2 is a signal line connected to the predetermined internal circuits that are not shown here. These internal circuits operate during normal operation. This allows for the data output circuits 240-1 and 240-2 to output the data signals, output to the signal lines of the system paths SP1 and SP2, to the registers 211-1 and 211-2 of the interface circuit 210 during normal operation.

In contrast, when the level of the test mode signal TEST is appropriate to the test mode, the selectors 242-1 and 242-2 select the input terminals to which the outputs of the selectors 243-1 and 243-2 are fed, respectively. In addition, the selectors 243-1 and 243-2 are controlled in response to the scan enable signal SEN in the test mode.

We assume that the scan enable signal SEN is high during the data write and read periods in the test mode. When the scan enable signal SEN is high as described above, the selector 243-1 selects the scan signal SC, outputting this signal. On the other hand, the selector 243-2 selects the data fed from the register 241-1, outputting this data. Therefore, when the scan enable signal SEN is high, the register 241-2 is connected at the stage subsequent to the register 241-1. That is, a register series circuit is formed that includes registers successively connected in series. This register series circuit is an example of the second series circuit defined in one or more of the claims. On the other hand, such a register series circuit is also referred to as a scan chain.

Further, at this time, the selector 311-1 and 311-2 of the second chip 200-2 shown in FIG. 2 are controlled by the same high scan enable signal SEN to assume the following states. That is, the selector 311-2 selects the data fed from the register 241-2 of the first chip 200-1, outputting this data. The selector 311-1 selects and output the data fed from the register 312-2. As a result, a register series circuit is also formed in the second chip 200-2 that includes the registers 312-2 and 311-1 successively connected in series. This register series circuit in the second chip 200-2 is an example of the first series circuit defined in one or more of the claims.

In addition, the output terminal of the register 241-2 of the first chip 200-1 is connected to the input terminal of the register 312-2 of the second chip 200-2. As a result, a register series circuit is formed between the terminals TM11 and TM31 that includes the registers 241-1, 241-2, 312-2 and 312-1 connected in series in this order. In this circuit configuration, the scan signal data fed through the terminal TM11 in synchronism with the clock CLK and transfer clock TCLK is successively shifted to the registers at the subsequent stages.

During the data transfer period which will be described later in the test mode, on the other hand, the scan enable signal SEN is low. When the scan enable signal SEN is low, the selectors 243-1 and 243-2 select the pieces of data fed from the inverters 244-1 and 244-2, respectively. In this circuit configuration, each of the registers 241-1 and 241-2 successively toggles the value stored up to this point in synchronism with the clock CLK. It should be noted that each of the registers 241-1 and 241-2 is an example of the first data storage section defined in one or more of the claims.

[Operation Example During the Connection Test]

A description will be given below of an operation example of the multilayer semiconductor device 100 configured as described above during the connection test with reference to the timing diagram shown in FIG. 4.

During the connection test, the selectors 242-1 and 242-2 are controlled to steadily select the pieces of data fed respectively from the selectors 243-1 and 243-2 by the test mode signal TEST fed through the terminal TM51 shown in FIG. 2. In addition, a data write period is set during the connection test to allow for the registers 241 to store the initial value of transfer data. During this data write period, the high scan enable signal SEN is fed to the data output circuits 240-1 and 240-2. At the same time, the high scan enable signal SEN is also fed to the selectors 311-1 and 311-2 of the second chip 200-2.

As a result, the above-mentioned register series circuit is formed in the data output section 230 of the first chip 200-1. That is, a path is formed in which the data fed through the terminal TM11 is shifted from the register 241-1 to the register 241-2 in the first chip 200-1 and then to the registers 312-2 and 312-1 in this order in the second chip 200-2 before being output through the terminal TM31.

Figure 4:
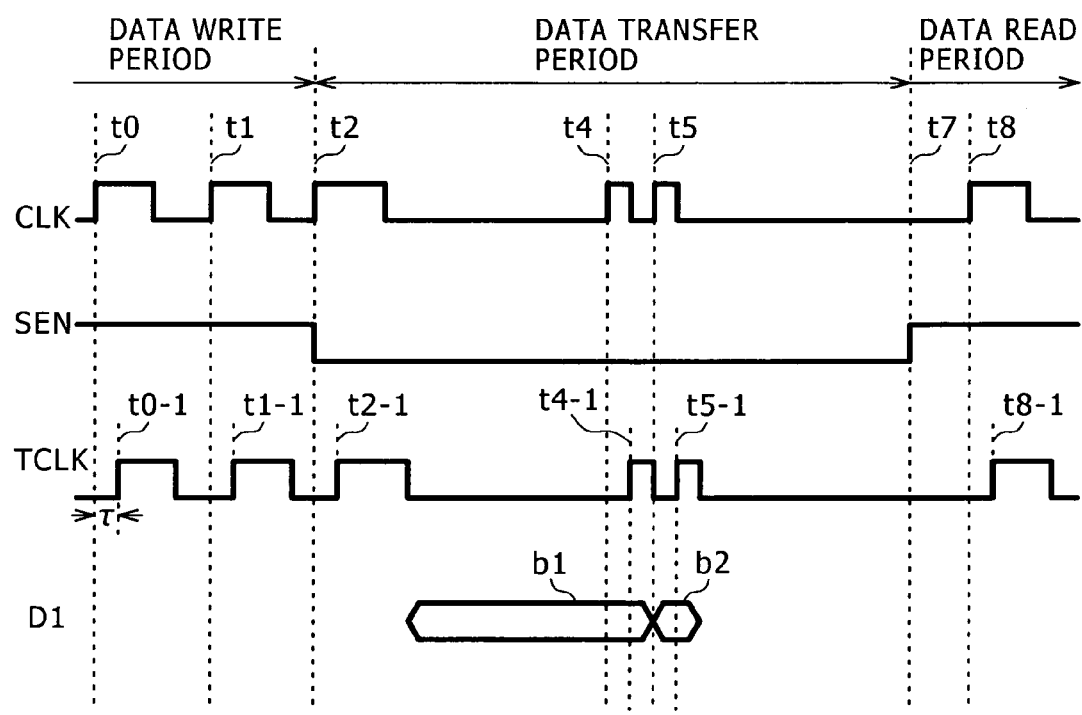
FIG. 4 is a timing diagram illustrating an operation example of the chips according to the first embodiment of the present disclosure.

Then, during the data write period in this case, two pulses of the clock CLK are output as illustrated in FIG. 4, one at time t0 and another at time t1, with the above-mentioned register series circuit formed. At this time, the tester successively receives data with a predetermined value as the scan signal SC through the terminal TM11 in synchronism with the two pulse periods of the clock CLK.

At this time, the registers 241-1 and 241-2 shift the data in synchronism with the clock CLK at times t0 and t1. As a result, the data with the predetermined value successively fed as the scan signal SC is stored in each of the registers 241-1 and 241-2. This is equivalent to the fact that the initial values of the transfer data D1 and D2 are written to the registers 241-1 and 241-2. The initial value of the transfer data D1 is bit b1 data transferred to the second chip 200-2 as will be described later. This bit data is the first to be transferred as the transfer data D1.

On the other hand, the clock CLK during the data write period is set to a frequency (frequency not intended for normal operation) lower than that which should normally be set during normal operation. As described above, setting a low frequency ensures that data is successively written to the registers 241 in a positive manner.

It should be noted that two pulses of the clock CLK are output during the data write period shown in FIG. 4 because the register series circuit in the data output section 230 is formed by the two registers 241. That is, during the data write period, as many pulses of the clock CLK are output as appropriate to the number of the registers 241 forming the register series circuit.

A description will be given next of the sections handling the transfer data D1 of the two pieces of transfer data D1 and D2. The transfer data D2 is similarly transferred from the first chip 200-1 to the second chip 200-2.

Next, the scan enable signal SEN is toggled low, thus setting the period from time t2 as a data transfer period. The data transfer period is designed to transfer the data written to the register 241-1 to the register 312-1 of the second chip 200-2 as the transfer data D2.

As a result of the scan enable signal SEN being toggled low during the data transfer period, a circuit is formed in the data output circuit 240-1 shown in FIG. 3. This circuit toggles and outputs the data stored in the register 211-1 in synchronism with the clock CLK. Further, the selector 311-1 of the second chip 200-2 is controlled to select the output of the input/output cell 320-1. As a result, a path is formed that feeds the data output from the data output circuit 240-1 to the register 312-1 via the register 211-1, phase adjustment circuit 220 and input/output cells 260-1 and 320-1. That is, a signal path is formed that transfers the transfer data D1 from the first chip 200-1 to the second chip 200-2. In this signal path, the circuit section making up the signal path of the first chip 200-1 is an example of the first transfer data shift circuit defined in one or more of the claims. Further, the circuit section making up the signal path from the input terminal of the transfer data D1 to the register 312-1 in the second chip 200-2 is an example of the second transfer data shift circuit defined in one or more of the claims.

Immediately after time t2 when the data transfer period begins, the data stored in the register 211-1 of the interface circuit 210 shown in FIG. 2 is not a value set specifically for the connection test. Instead, the data stored therein remains undefined. In the case of FIG. 2, the register 211-1 is the register at the final stage of the signal path of the first chip 200-1 adapted to transfer the transfer data D1. Therefore, if data transfer is conducted in this condition, the transfer data with an undefined value is transferred to the second chip 200-2. Therefore, the clock CLK is output once at a frequency not intended for normal operation as illustrated at time t2 in FIG. 4. Thanks to the clock CLK output at time t2, the bit b1 data, i.e., the initial value of the transfer data D1 stored in the register 241-1 during the data write period, is transferred to the register 211-1 and stored therein. That is, the bit b1 data is stored in the register at the final stage of the path adapted to transfer the transfer data D1 in the first chip 200-1. It should be noted that a toggling circuit is formed at this time in the data output circuit 240-1. The toggling circuit feeds back the output of the register 241-1 to its input via the inverter 244-1. This allows for the register 241-1 to store the transfer data of a bit b2 in response to the clock CLK output at time t2. The transfer data of the bit b2 is obtained by toggling the initial value.

After the data transfer at time t2 during the data transfer period, two pulses of the clock CLK are output continuously, one at time t4 and another at time t5. It should be noted, however, that the clock CLK is generated at times t4 and t5, for example, at the same frequency as for normal operation (frequency intended for normal operation).

It should be noted that the clock CLK generated as described above is first adjusted in phase by the phase adjustment circuit 220 before being output to the second chip 200-2 as the transfer clock TCLK as shown in FIG. 2. The transfer clock TCLK is delayed by a delay time τ relative to the clock CLK due to transmission delay in the signal path including the phase adjustment circuit 220 as illustrated in FIG. 4.

Then, in response to the output of the clock CLK at time t4, the bit b1 data stored in the register 211-1 is stored in the register 312-1 in synchronism with the transfer clock TCLK at time t4-1. As a result, the transfer data D1 serving as the bit b1 is transferred between the chips 200. Further, the bit b2 data stored in the register 241-1 is shifted to the register 211-1 of the interface circuit 210 and stored therein.

Next, in response to the output of the clock CLK at time t5, the bit b2 data stored in the register 211-1 is transferred to and stored in the register 312-1 in synchronism with the transfer clock TCLK at time t5-1 as the transfer data D1.

The bit string of the transfer data D1 made up of the bits b1 and b2 is successively transferred from the first chip 200-1 to the second chip 200-2. As a result, the bit b2 data is stored in the register 312-1 after time t5-1. It should be noted that the data transferred as the transfer data D2 at the same time as the bit b2 is similarly stored in the register 312-2 after time t5-1. The string of the bits b1 and b2 is transferred using the transfer clock TCLK at the frequency intended for normal operation at times t4-1 and t5-1. That is, data transfer is conducted at the speed set during normal operation. It should be noted that the bit b1 is transferred from the register 241-1 to the register 211-1 at time t2 over the system path. Therefore, it is possible to transfer the data at time t2 at the frequency intended for normal operation using the clock CLK. That is, data can be transferred over the system path during the data transfer period at the frequency intended for normal operation. It should be noted, however, that the data transferred from the register 211-1 to the register 312-1 of the second chip 200-2 at this time is not significant data used for testing. In the present embodiment of the disclosure, therefore, data transfer is conducted at time t2 at the frequency not intended for normal operation to ensure that the data under test is positively stored in the final register 211-1 of the first chip 200-1.

Next, the tester toggles the scan enable signal high again at time t7 in a predetermined time after time t5, thus setting a data read period. A register series circuit is formed similarly during the data read period as during the data write period because of the high scan enable signal SEN.

Here, at time t5 and beyond, the register 312-1 of the data input section 310 continues to store the bit b2 data. The register 312-2 also continues to store the data updated at time t5 at the same time as the bit b2 data. As a result of the formation of a register series circuit at time t7 as described above, the bit b2 stored in the register 312-1 is fed to the terminal TM31 as output data Dout.

Then, in this condition, the clock generation section 250 outputs the clock CLK once at time t8 in a predetermined time after time t7. It should be noted that the clock CLK output at time t8 is at a low frequency not intended for normal operation. On the other hand, the number of times the clock CLK is to be output is once at time t8 and beyond during the data read period shown in FIG. 4 because the register series circuit in the data input section 310 shown in FIG. 2 is formed by the two registers 312. Letting the number of the registers 312 be denoted by "M," it is only necessary to output the clock CLK "M−1" times at time t8 and beyond.

In response to the clock CLK output at time t8, the data is shifted from the register 312-2 to the register 312-1 and output to the TN31 as the output data Dout in synchronism with the transfer clock TCLK output at time t8-1. As described above, two pieces of data, the transfer data D1, i.e., the bit b2 stored in the register 312-1, and the transfer data D2 stored in the register 312-2 and having the same timing as the bit b2, are successively fed to the terminal TM31. That is, the transfer data D1 and D2 transferred to the second chip 200-2 is read by the tester. On the other hand, when the data is read, a low frequency not intended for normal operation is set as described above, thus allowing for the data to be read positively.

Then, the tester compares the value of the transfer data D1 and D2 against an expected value. The term "expected value" here refers to the data stored in the register 241-1 of the data output circuit 240-1 and the register 241-2 of the data output circuit 240-2 when the clock CLK is output at time t2. Here, it can be determined that the connection is appropriate between the paths adapted to transmit the transfer data D1 and D2 when the two values match as a result of comparison. It can be determined that the connection is not appropriate therebetween if the two values do not match as a result of comparison.

On the other hand, the bits b1 and b2 transferred as the transfer data D1 are output by the phase adjustment circuit 220 at proper timings as illustrated in FIG. 4 so that the setup and hold times are guaranteed with respect to the transfer clock TCLK at the frequency intended for normal operation. That is, the bit b2 is output earlier than the leading edge of the transfer clock TCLK output at time t5-1. That is, the setup time is guaranteed. On the other hand, the output of the bit b1 is stopped in a given time after the leading edge of the transfer clock TCLK output at time t4-1, thus indicating that the hold time is guaranteed.

Therefore, when the connection is determined to be appropriate between the paths adapted to transmit the transfer data D1 during the connection test according to the present embodiment of the disclosure, it can be also determined that the setup time is properly guaranteed.

In the related art described above, for example, a different test clock is used for each chip for data transfer between chips. This test clock is at a frequency lower than that intended for normal operation and corresponds to the frequency not intended for normal operation according to the present embodiment of the disclosure. Therefore, it is difficult to transfer data at the practical speed for normal operation as in the present embodiment of the disclosure. Further, the circuit made up of a flip-flop and switch for data transfer is directly connected to each of the terminals. As a result, it is difficult to transmit transfer data via the circuits used also for normal operation such as the phase adjustment circuit 220 according to the present embodiment of the disclosure. Therefore, the testing according to the related art does not go beyond DC characteristic testing to determine whether there is connectivity in interconnects between chips. The related art is similar in this regard to the boundary-scan technique. In contrast, the present embodiment of the disclosure allows for AC characteristic tests such as the setup time test to be conducted simultaneously with the connection test.

Further, in the related art, the circuit made up of a flip-flop and selector for the connection test is provided in the portion for the input/output cell closest to the output terminal of the chip as with the boundary scan technique. In this case, the portion operating during the connection test is in a condition equivalent to being cut off from the system path, thus making it difficult to conduct the system path test.

In the present embodiment of the disclosure, on the other hand, the data output section 230 is provided at the stage previous to the circuit used for normal operation which is shown, for example, as the interface circuit 210. During normal operation, the signal path from the input of the data output circuit 240 to the interface circuit 210 serves as the system path SP. This means that the path adapted to transfer data for testing includes the system path SP. As a result, in the present embodiment of the disclosure, the test is conducted to determine whether data is properly transferred over the system path together with the connection test.

2. Second Embodiment

[Internal Configuration Example of the Chips]

Figure 5:
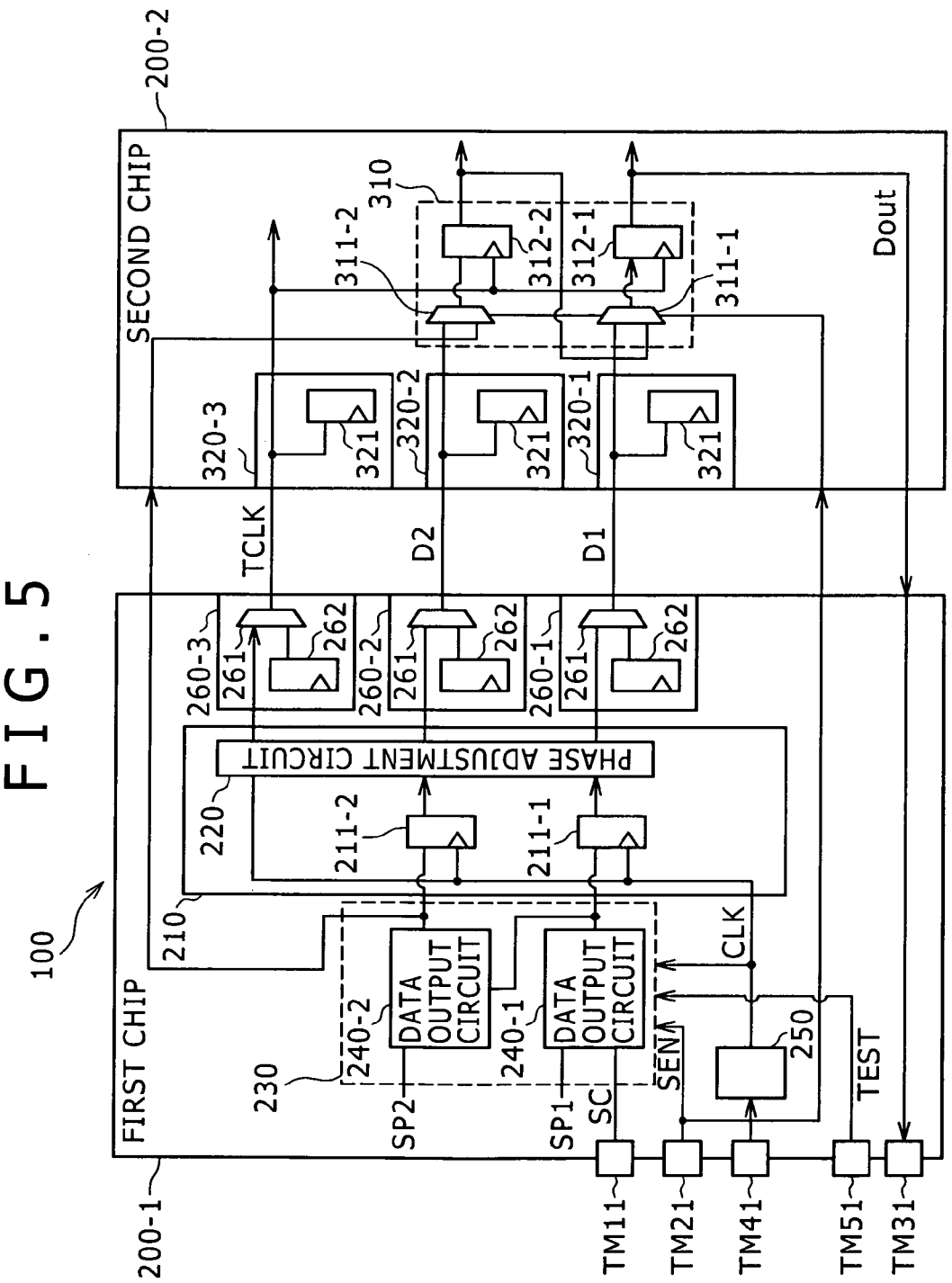
FIG. 5 is a diagram illustrating a configuration example of the chips according to a second embodiment of the present disclosure.

FIG. 5 illustrates a configuration example of the chips 200 in the multilayer semiconductor device 100 according to a second embodiment of the present disclosure. It should be noted that, in FIG. 5, the same components as those in FIG. 2 are denoted by the same reference numerals, and that the description thereof is omitted.

FIG. 5 illustrates a configuration obtained by adding the configuration for the boundary-scan technique to that according to the first embodiment of the present disclosure shown in FIG. 2. That is, a selector 261 and boundary-scan cell 262 are provided for each of the input/output cells 260-1 to 260-3 of the chip 200-1. Each of the selectors 261 selects either the signal transmitted from the register 211-1 by way of the phase adjustment circuit 220 or the data output from the boundary-scan cell 262, outputting the selected input. Although not illustrated here, each of the selectors 261 is switched by a control signal fed from the external tester or other equipment through a predetermined terminal. Although again not illustrated here, the boundary-scan cells 262 of the input/output cells 260-1 to 260-3 are successively connected in series, and both ends thereof are connected, for example, to a tester via terminals such as pads provided on the first chip 200-1.

On the other hand, a boundary-scan cell 321 is provided for each of the input/output cells 320-1 to 320-3 of the second chip 200-2. Each of the boundary-scan cells 321 receives a signal fed to and branched from the associated input/output cell 320. On the other hand, although not illustrated here, the boundary-scan cells 321 of the input/output cells 320-1 to 320-3 are successively connected in series, and both ends thereof are connected, for example, to a tester via terminals such as pads provided on the second chip 200-2.

As described above, the circuits for the boundary-scan technique are added in the second embodiment of the present disclosure. The present embodiment of the disclosure is designed to perform the connection test between chips and, in this regard, serves as an alternative to the boundary-scan technique. However, there are cases depending, for example, on the structure of the actual integrated semiconductor device under test, in which it is preferred to use the connection test according to the boundary-scan technique in combination with the connection test according to the embodiments of the present disclosure. Therefore, the configuration according to the second embodiment of the present disclosure makes it possible to perform not only the connection test according to the embodiments of the present disclosure but also that according to the boundary-scan technique.

3. Third Embodiment

[Internal Configuration Example of the Chips]

Figure 6:
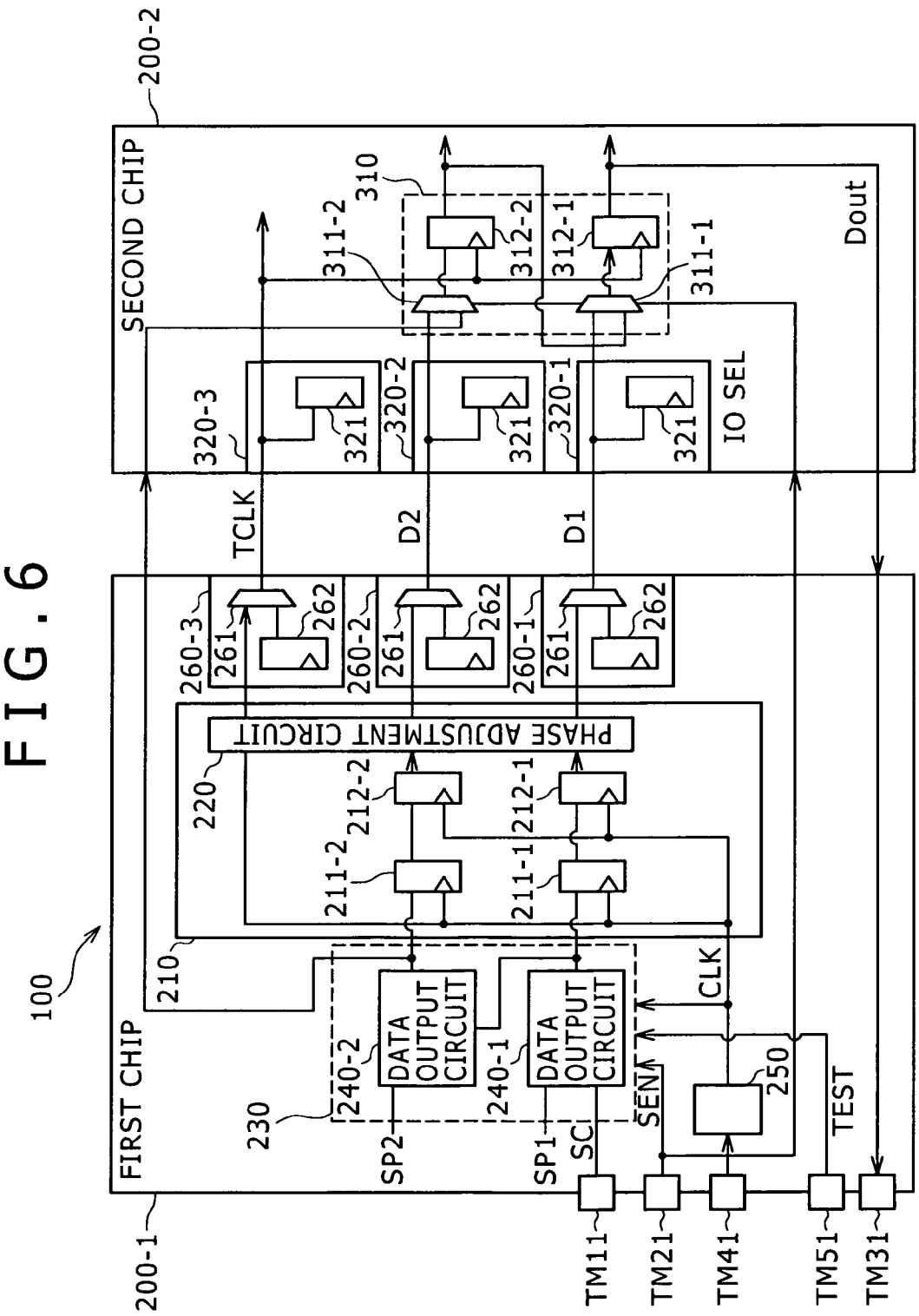
FIG. 6 is a diagram illustrating a configuration example of the chips according to a third embodiment of the present disclosure.

FIG. 6 illustrates a configuration example of the chips 200 in the multilayer semiconductor device 100 according to a third embodiment of the present disclosure. It should be noted that, in FIG. 6, the same components as those in FIG. 5 are denoted by the same reference numerals, and that the description thereof is omitted.

The configuration shown in FIG. 6 differs from that shown in FIG. 5 in that registers 212-1 and 212-2 are added to the interface circuit 210. The register 212-1 is inserted in the signal path between the register 211-1 and phase adjustment circuit 220. That is, the data output from the register 211-1 is fed to the register 212-1. The data output from the register 212-1 is supplied to the phase adjustment circuit 220. The register 212-2 is similarly inserted in the signal path between the register 211-2 and phase adjustment circuit 220. The registers 212-1 and 212-2 operate in synchronism with the clock CLK. As described above, in the third embodiment, series circuits, each made up of two registers, are formed in the data signal paths of the interface circuit 210. Each of these series circuits made up of the registers is an example of the first transfer data shift circuit defined in one or more of the claims. On the other hand, each of the registers 211-1, 221-1, 211-2 and 221-2 making up each of the register series circuits is an example of the third data storage section.

The circuits used during normal operation such as the interface circuit 210 have a different number of register stages inserted in the signal paths depending, for example, on the design specification. FIG. 6 illustrates a configuration obtained by adding one register stage to the configuration shown in FIG. 5 as an example thereof.

[Operation Example During the Connection Test]

A description will be given below of an operation example of the multilayer semiconductor device 100 configured as shown in FIG. 6 during the connection test with reference to the timing diagram shown in FIG. 7. It should be noted that the description of the operation identical to that shown in the timing diagram of FIG. 4 is omitted.

Figure 7:
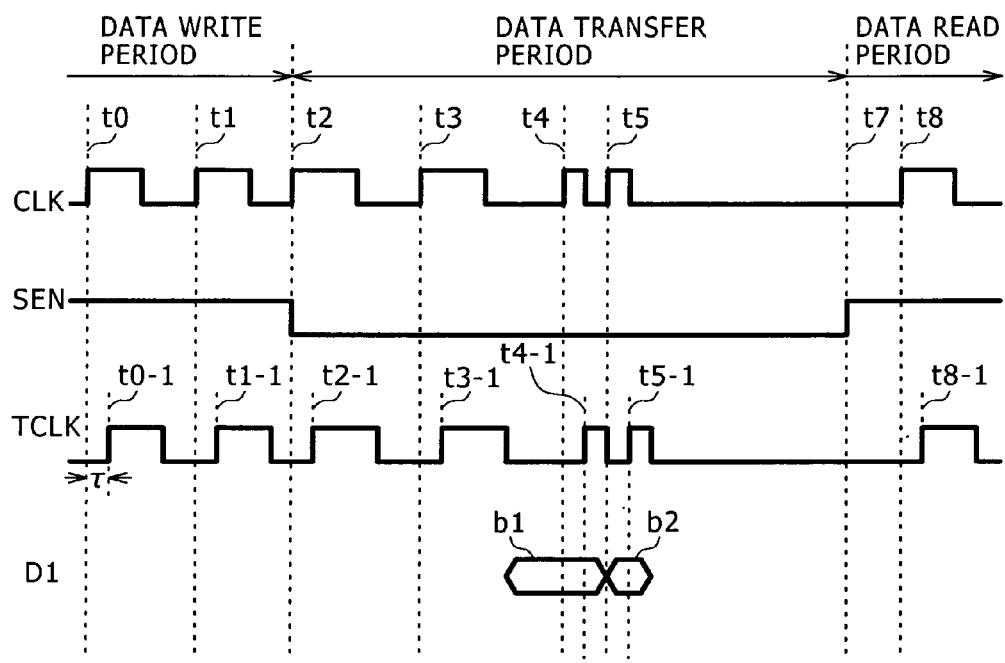
FIG. 7 is a timing diagram illustrating an operation example of the chips according to the first embodiment of the present disclosure.

The timing diagram shown in FIG. 7 differs from that shown in FIG. 5 in that two pulses of the clock CLK are output at the frequency not intended for normal operation at times t2 and t3 during the data transfer period.

As a result of the output of the clock CLK at times t2 and t3 as described above, the bit b1 data stored in the register 211-1 prior to time t2 is shifted further from the register 211-1 and stored in the register 212-1. On the other hand, the bit b2 data stored in the register 241-1 is stored in the register 211-1. That is, the bit b1 data is stored in the register at the final stage of the signal path adapted to transfer the transfer data D1 in the first chip 200-1, and the bit b2 data is stored in the register at the stage previous thereto. It should be noted that the data transfer at times t2 and t3 is also conducted in the system path. Therefore, the data may be transferred using the clock CLK at the frequency intended for normal operation.

In the above condition, the clock CLK is output twice at times t4 and t5 at the frequency intended for normal operation. As a result, the bit b1 data stored in the register 212-1 is transferred first at time t2 and stored in the register 312-1 of the second chip 200-2. Next, at time t5, the bit b1 data is transferred from the register 212-1 to the register 312-1.

Hereafter, the transfer clock TCLK is output at a frequency not intended for normal operation at time t8 during the data read period that begins from time t7 as with the operation shown in FIG. 4. This allows for the data to be shifted using the register series circuit made up of the registers 312-1 and 312-2 and output to the terminal TM31 as the data Dout.

As described above, in the third embodiment, the clock CLK is output as many times as appropriate to the number of register stages inserted in the signal path of the system path in the first chip 200-1 prior to time t4 when the data is transferred between the chips. This makes it possible to transfer only the transfer data, i.e., the bits b1 and b2 stored in the registers 241, using the clock CLK at the frequency intended for normal operation, irrespective of the number of register stages provided in the signal paths adapted to transfer the transfer data D1 in the first chip 200-1.

4. Fourth Embodiment

[Internal Configuration Example of the Chips]

Figure 8:
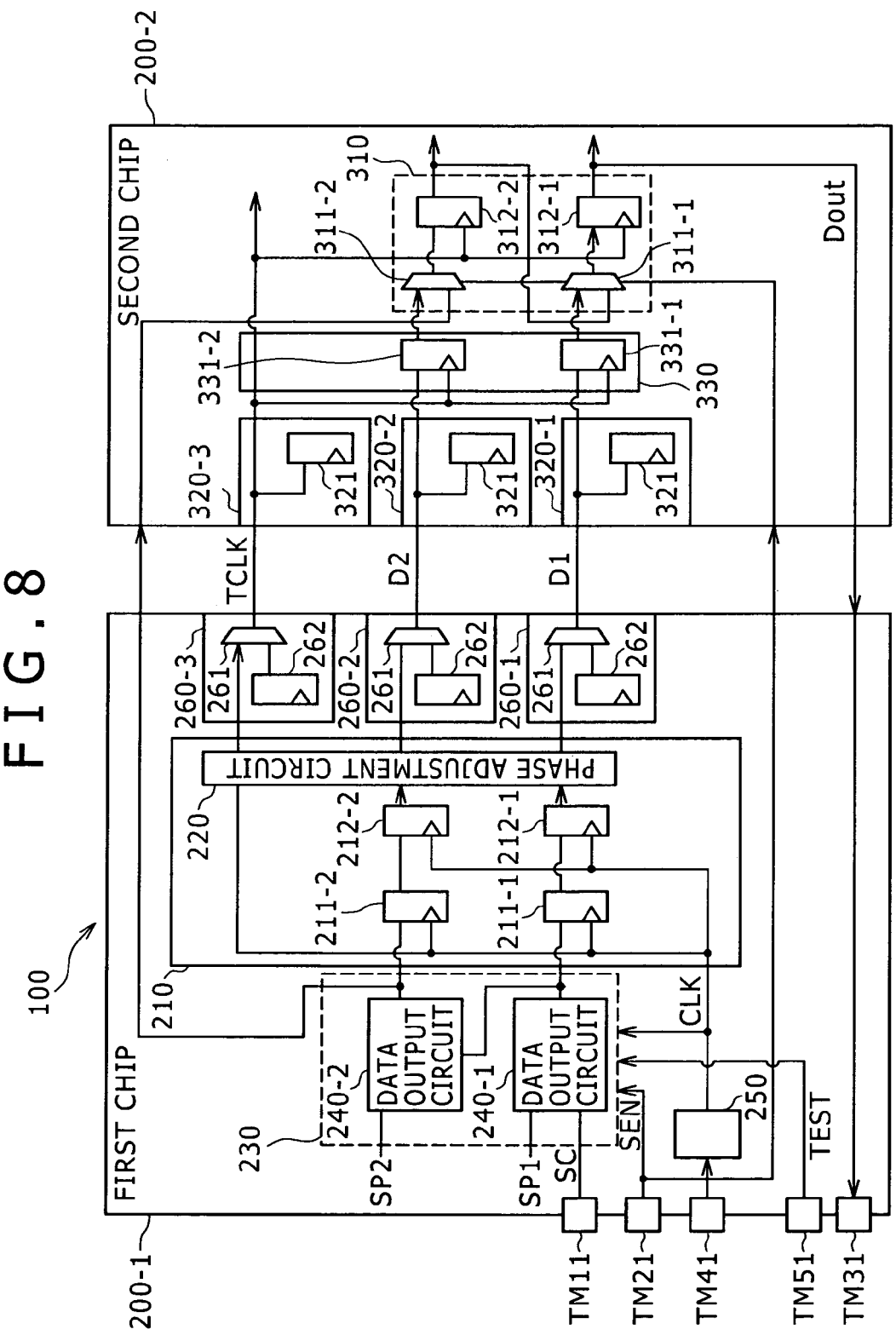
FIG. 8 is a diagram illustrating a configuration example of the chips according to a fourth embodiment of the present disclosure.

FIG. 8 illustrates a configuration example of the chips 200 in the multilayer semiconductor device 100 according to a fourth embodiment of the present disclosure. It should be noted that, in FIG. 8, the same components as those in FIG. 6 are denoted by the same reference numerals, and that the description thereof is omitted.

The configuration shown in FIG. 8 differs from that shown in FIG. 6 in that an interface circuit 330 is added to the previous stage of the data input section 310 of the second chip 200-2. The interface circuit 330 includes registers 331-1 and 331-2. The register 331-1 is inserted between the output of the input/output cell 320-1 adapted to receive the transfer data D1 and the selector 311-1 of the data input section 310. The register 331-2 is inserted between the output of the input/output cell 320-2 adapted to receive the transfer data D2 and the selector 311-2 of the data input section 310. That is, one register is added to the previous stage of each of the registers 312-1 and 312-2 of the data input section 310. Each of these registers 312-1 and 312-2 operates in synchronism with the transfer clock TCLK. It should be noted that the internal configuration of the second chip 200-2 is an example designed to meet the actual specifications as with the third embodiment. On the other hand, each of the registers 331-1 and 331-2 is an example of the fourth data storage section and an example of the second transfer data shift circuit defined in one or more of the claims.

[Operation Example During the Connection Test]

A description will be given below of an operation example of the multilayer semiconductor device 100 configured as shown in FIG. 8 during the connection test with reference to the timing diagram shown in FIG. 9. It should be noted that the description of the operation identical to that shown in the timing diagram of FIG. 7 is omitted.

Figure 9:
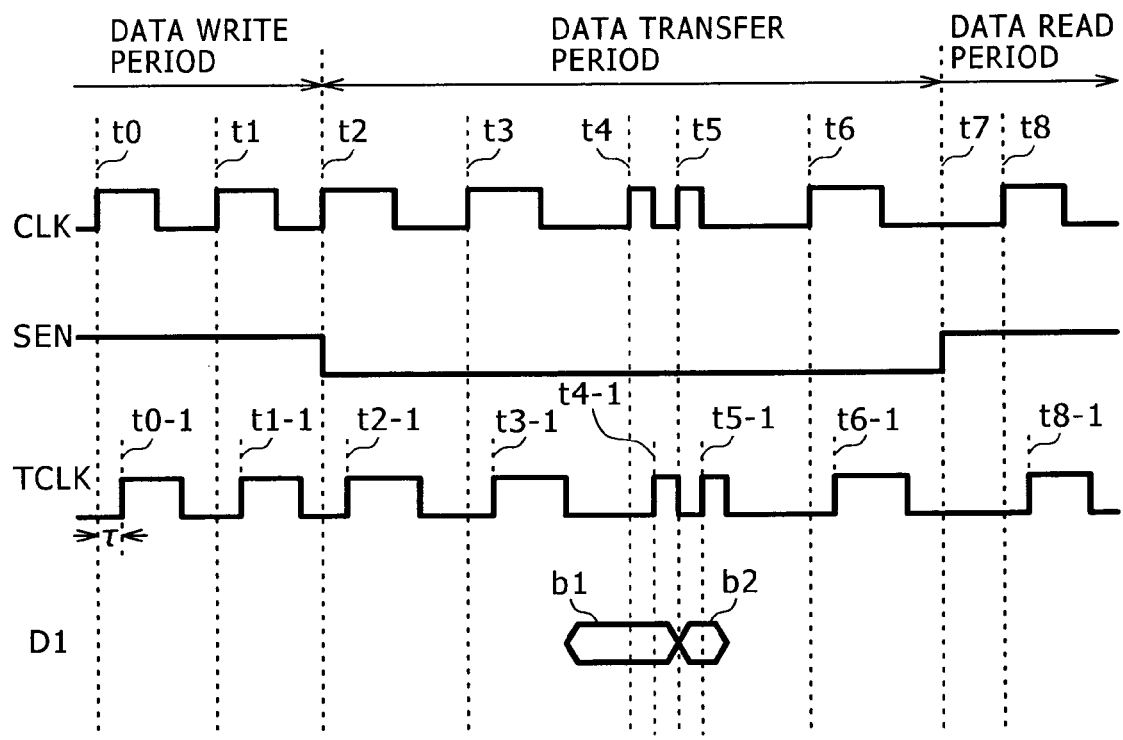
FIG. 9 is a timing diagram illustrating an operation example of the chips according to the fourth embodiment of the present disclosure.

The timing diagram shown in FIG. 9 differs from that shown in FIG. 7 in that the clock CLK is output once at the frequency not intended for normal operation at time t6 after the data transfer to the second chip 200-2 at times t4 and t5 during the data transfer period.

In the case of the configuration of the second chip 200-2 shown in FIG. 8, the bit b2 data stored in the register 241-1 at time t2 is stored in the register 331-1 at time t5. That is, the bit b2 data has yet to be transferred to the register 312-1 of the data input section 310. Instead, the register 312-1 stores the bit b1 data.

In this case, therefore, the clock CLK is output once at time t6. This transfers the bit b2 data to the register 312-1, thus allowing for the register 312-1 to store the bit b2 data. Hereinafter, the same operation conducted during the data read period as that shown in FIG. 7 is performed, thus allowing for the data stored in the registers 312-1 and 312-2 to be shifted and output to the tester through the terminal TM31. It should be noted that the data transfer at time t6 is also conducted in the system path. Therefore, the clock CLK may be at the frequency intended for normal operation.

As described above, in the fourth embodiment of the present disclosure, the clock CLK is output at the frequency intended for normal operation as many times as appropriate to the number of register stages inserted in the signal path in the second chip 200-2. This allows for the transfer data transmitted from the first chip 200-1 to be stored in and read from the registers 312.

In addition to the above, in the fourth embodiment, the number of times the clock CLK adapted to shift the data at time t6 and beyond is to be output at a frequency not intended for normal operation is changed, thus allowing for the AC characteristic test to be conducted.

Although not illustrated with a timing diagram, and assuming that the circuit configured as shown in FIG. 8 is used, the clock CLK is not output at time t6 during the data transfer period, and the data read period begins at time t7. That is, it can be considered in this case that the number of times the clock CLK is to be output at a frequency not intended for normal operation has been changed from one to zero.

In the above operation, the register 312-1 stores the bit b1 data, i.e., the data previous to the bit b2 data, rather than the bit b2 data when the data transfer period ends. Therefore, this bit b1 is read during the data read period.

We assume here that the transfer clock TCLK for the transfer data D1 output from the phase adjustment circuit 220 is delayed more than allowed and therefore does not guarantee the hold time. In this case, the register 331-1 ends up storing the bit b2 data rather than the bit b1 data at time t4-1 when the transfer clock TCLK is output.

Based on this, it is possible to test whether or not the hold time is guaranteed using the value of the bit b1 data read from the register 331-1. More specifically, the bit b1 data read from the register 331-1 by the tester as the output data Dout is compared against that stored in the register 241-1 using the scan signal SC. When the two values match, it means that the delay time of the transfer clock TCLK is in the allowable range. That is, it is determined that the hold time is guaranteed. In contrast, we assume that the two values do not match, and that the value of the bit b1 read from the register 331-1 matches the value of the bit b2 stored in the register 241-1. In this case, it is determined that the transfer clock TCLK is delayed more than allowed and that the hold time is not guaranteed.

As described above, in the fourth embodiment, the hold time test can also be conducted by setting an appropriate number of times the clock CLK is to be output at time t5 and beyond during the data transfer period.

5. Fifth Embodiment

[Internal Configuration Example of the Chips]

Figure 10:
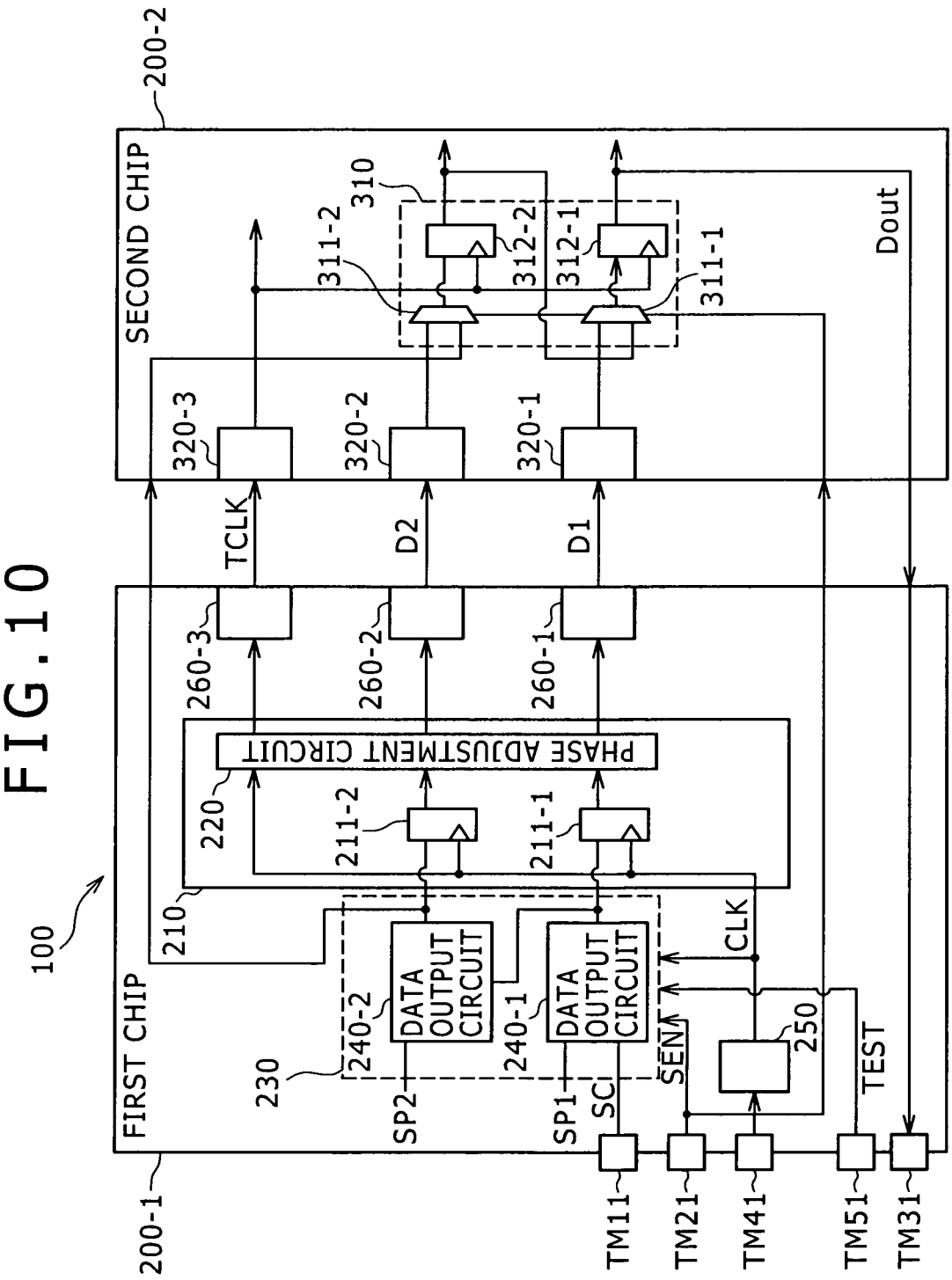
FIG. 10 is a diagram illustrating a configuration example of the chips according to the fourth embodiment of the present disclosure.

FIG. 10 illustrates a configuration example of the chips 200 in the multilayer semiconductor device 100 according to a fifth embodiment of the present disclosure. It should be noted that, in FIG. 10, the same components as those in FIG. 2 are denoted by the same reference numerals, and that the description thereof is omitted.

In the first chip 200-1 shown in FIG. 10, terminals TM12 and TM32 are added to the configuration of the first chip 200-1 shown in FIG. 2. It should be noted that the terminals TM12 and TM32 are also connected to the tester. The terminal TM12 is connected to the output of the data output circuit 240-2, i.e., the output terminal of the register 241-2. The terminal TM32 is connected to one of the input terminals of the selector 311-2 of the second chip 200-2. In this configuration, the terminals TM11 and TM12 are connected, respectively, to the two ends of the register series circuit made up of the registers 241-1 and 241-2 (FIG. 3) of the first chip 200-1. Similarly, the terminals TM31 and TM32 are connected, respectively, to the two ends of the register series circuit made up of the registers 312-1 and 312-2 of the second chip 200-2.

In FIG. 2, a register series circuit is formed by the registers 241-1 and 241-2 of the first chip 200-1 and the registers 312-1 and 312-2 of the second chip 200-2. In contrast, in the fifth embodiment configured as described above, separate register series circuits are formed in the first and second chips 200-1 and 200-2.

[Operation Example During the Connection Test]

The multilayer semiconductor device 100 configured as shown in FIG. 10 operates during the connection test in the same manner as that according to the first embodiment shown in FIG. 4. In the case of the configuration shown in FIG. 10, the tester writes data as follows during the data write period. That is, the tester feeds data with a predetermined value through the terminal TM11 to the register series circuit, connected between the terminals TM11 and TM12 and made up of the registers 241-1 and 241-2, at times t0 and t1 in synchronism with the clock CLK. Further, during the data read period, the tester shifts the data to the registers 312-1 and 312-2 connected between the terminals TM31 and TM32, receiving the output data Dout output through the terminal TM31 as a result of the shifting of the data.

As described above, in the fifth embodiment, data can be separately written to and read from each of the register series circuits in the first and second chips 200-1 and 200-2. Such a configuration can be readily modified, for example, so that the terminals TM31 and TM32 are provided in the second chip 200-2.

It should be noted that the multilayer semiconductor device 100 having the first and second chips 200-1 and 200-2 stacked one on top of another has been presented as an example in the above embodiments. However, the integrated semiconductor device may have the first and second chips 200-1 and 200-2 arranged along a level surface.

Further, in the above embodiments, synchronism is maintained between the transfer clock and transfer data in such a manner that the phase adjustment circuit 220 guarantees the setup and hold times. However, even in the absence of the phase adjustment circuit 220, it is possible to transfer the transfer data together with the transfer clock. Even in this case, therefore, it is possible to determine whether or not the data is transferred at proper timings at the data transfer speed intended for normal operation.

On the other hand, the embodiments of the present disclosure are merely examples of implementing the present disclosure. As pointed out explicitly in the embodiments of the present disclosure, there are correspondences between the features of the embodiments of the present disclosure and the particular features of the disclosure set forth in the claims. Similarly, there are correspondences between the particular features of the disclosure set forth in the claims and the identically named features of the embodiments of the disclosure. It should be noted, however, that the present disclosure is not limited to the embodiments described above, but may be implemented in various forms without departing from the scope and spirit of the present disclosure.

The procedure described in the embodiments of the present disclosure may be interpreted as a method having the series of steps, or a program causing a computer to execute the above series of steps or a recording medium storing the program. Among recording media that can be used as a recording medium are a CD (Compact Disc), an MD (MiniDisc), a DVD (Digital Versatile Disk), a memory card and a Blu-ray Disc (registered trademark).

The present disclosure contains subject matter related to that disclosed in Japanese Priority Patent Application JP 2010-167771 filed in the Japan Patent Office on Jul. 27, 2010, the entire content of which is hereby incorporated by reference.

What is claimed is:

1. An integrated semiconductor device comprising:
   first and second semiconductor devices, wherein the first semiconductor device includes:
      a clock generation section adapted to generate a clock,
      first data storage sections adapted to store input data as transfer data to be transferred to the second semiconductor device in synchronism with the clock,
      data output terminals provided, one for each of the first data storage sections, to output the transfer data, and a clock output terminal adapted to output the clock as a transfer clock, and the second semiconductor device includes:
data input terminals connected to the data output terminals to receive the transfer data,
a clock input terminal connected to the clock output terminal to receive the transfer clock,
second data storage sections each of which is associated with one of the data input terminals to store input data in synchronism with the transfer clock, and
selection sections each of which is associated with one of the second data storage sections and selects either the transfer data received from the data input terminal or data shifted and output to the associated second data storage section in a first series circuit, the first series circuit being formed by successively connecting the second data storage sections in series, each of the selection sections supplying the selected data to the associated second data storage section,
wherein the clock generation section generates the clock at a data transfer frequency for a predetermined data transfer speed so that the transfer data is transferred to the second semiconductor device at the predetermined data transfer speed, and
wherein the first semiconductor device includes a first transfer data shift circuit formed by successively connecting in series one or more third data storage sections in a transmission path of the transfer data from the first data storage section to the data output terminal, the third data storage sections adapted to store input data in synchronism with the clock, wherein the clock generation section generates the clock that includes the number of pulses set based on the number of the third data storage sections so that the data stored in the first data storage section is shifted to and stored in the third data storage section at the final stage of the first transfer data shift circuit.

2. The integrated semiconductor device of claim 1, wherein the first semiconductor device further includes:
a phase adjustment section adapted to set a predetermined phase difference between the transfer data and transfer clock so that the hold time and setup time conditions are fulfilled, the phase adjustment section also adapted to output the transfer data and transfer clock with the predetermined phase difference therebetween from the data output terminal and clock output terminal, respectively.

3. The integrated semiconductor device of claim 1, wherein when generating the clock that includes the number of pulses set based on the number of the third data storage sections, the clock generation section sets a frequency lower than the data transfer frequency.

4. The integrated semiconductor device of claim 1, wherein the second semiconductor device further includes:
a second transfer data shift circuit formed by successively connecting in series fourth data storage sections in the transmission path of the transfer data from the data input terminal to the second data storage sections, the fourth data storage sections adapted to store input data in synchronism with the clock, and
the clock generation section generates the clock that includes the number of pulses set based on the number of the fourth data storage sections provided from the predetermined fourth data storage section to the final stage so that the transfer data stored in the predetermined fourth data storage section in the second transfer data shift circuit is shifted to and stored in the second data storage section.

5. The integrated semiconductor device of claim 4, wherein when generating the clock that includes the number of pulses set based on the number of the fourth data storage sections provided from the predetermined fourth data storage section to the final stage, the clock generation section sets a frequency lower than the data transfer frequency.

6. The integrated semiconductor device of claim 1, further comprising:
a second series circuit formed by successively connecting the first data storage sections in series to successively receive data with a predetermined value,
wherein the clock generation section generates the clock that includes the number of pulses set based on the number of the first data storage sections so that the data with the predetermined value is stored in the first data storage section as the transfer data.

7. The integrated semiconductor device of claim 1, wherein the clock generation section generates the clock that includes the number of pulses set based on the number of the second data storage sections so that the transfer data stored in the second data storage sections is successively output from the first series circuit to an external equipment.

8. The integrated semiconductor device of claim 1, further comprising:
a transfer data toggling circuit adapted to successively toggle the value of the transfer data stored in the first data storage sections in synchronism with the clock.

9. An integrated semiconductor device comprising:
first and second semiconductor devices, wherein the first semiconductor device includes:
a clock generation section adapted to generate a clock,
first data storage sections adapted to store input data as transfer data to be transferred to the second semiconductor device in synchronism with the clock, wherein the clock generation section generates the clock at a data transfer frequency for a predetermined data transfer speed so that the transfer data is transferred to the second semiconductor device at the predetermined data transfer speed,
data output terminals provided, one for each of the first data storage sections, to output the transfer data, and
a clock output terminal adapted to output the clock as a transfer clock, and the second semiconductor device includes:
data input terminals connected to the data output terminals to receive the transfer data,
a clock input terminal connected to the clock output terminal to receive the transfer clock,
second data storage sections each of which is associated with one of the data input terminals to store input data in synchronism with the transfer clock, and
selection sections each of which is associated with one of the second data storage sections and selects either the transfer data received from the data input terminal or data shifted and output to the associated second data storage section in a first series circuit, the first series circuit being formed by successively connecting the second data storage sections in series, each of the selection sections supplying the selected data to the associated second data storage section, and
a second series circuit formed by successively connecting the first data storage sections in series to successively receive data with a predetermined value, wherein the clock generation section generates the clock that includes the number of pulses set based on the number of the first data storage sections so that the data with the predetermined value is stored in the first data storage section as the transfer data and when generating the clock that includes the number of pulses set based on the number of the first data storage sections the clock generation section sets a frequency for the clock lower than the data transfer frequency.

10. An integrated semiconductor device comprising:
first and second semiconductor devices, wherein the first semiconductor device includes:
  a clock generation section adapted to generate a clock,
  first data storage sections adapted to store input data as transfer data to be transferred to the second semiconductor device in synchronism with the clock, wherein the clock generation section generates the clock at a data transfer frequency for a predetermined data transfer speed so that the transfer data is transferred to the second semiconductor device at the predetermined data transfer speed,
  data output terminals provided, one for each of the first data storage sections, to output the transfer data, and
  a clock output terminal adapted to output the clock as a transfer clock, and
the second semiconductor device includes:
  data input terminals connected to the data output terminals to receive the transfer data,
  a clock input terminal connected to the clock output terminal to receive the transfer clock,
  second data storage sections each of which is associated with one of the data input terminals to store input data in synchronism with the transfer clock, wherein the clock generation section generates the clock that includes the number of pulses set based on the number of the second data storage sections so that the transfer data stored in the second data storage sections is successively output from a first series circuit to an external equipment and when generating the clock that includes the number of pulses set based on the number of the second data storage sections, the clock generation section sets a frequency for the clock lower than the data transfer frequency, and
  selection sections each of which is associated with one of the second data storage sections and selects either the transfer data received from the data input terminal or data shifted and output to the associated second data storage section in the first series circuit, the first series circuit being formed by successively connecting the second data storage sections in series, each of the selection sections supplying the selected data to the associated second data storage section.

* * * * *